(12) United States Patent
Zhou et al.

(10) Patent No.: US 6,175,236 B1
(45) Date of Patent: Jan. 16, 2001

(54) METHOD FOR ACQUIRING SPATIALLY AND SPECTRALLY SELECTIVE MR IMAGES

(75) Inventors: Xiaohong Zhou, Pewaukee; Matthew A. Bernstein, Waukesha, both of WI (US)

(73) Assignee: General Electric Company, Milwaukee, WI (US)

( * ) Notice: Under 35 U.S.C. 154(b), the term of this patent shall be extended for 0 days.

(21) Appl. No.: 09/047,822

(22) Filed: Mar. 25, 1998

(51) Int. Cl.$^7$ ................................................... G01V 3/00

(52) U.S. Cl. ........................................... 324/307; 324/309

(58) Field of Search ..................................... 324/307, 309

(56) References Cited

U.S. PATENT DOCUMENTS

| | | | |
|---|---|---|---|
| 4,698,591 | 10/1987 | Glover et al. | 324/307 |
| 4,999,580 | 3/1991 | Meyer et al. | 324/309 |
| 5,729,138 | 3/1998 | Purdy et al. | 324/309 |
| 5,856,744 | * 1/1999 | Block et al. | 324/309 |
| 5,864,233 | * 1/1999 | Zhou et al. | 324/309 |

OTHER PUBLICATIONS

"A Fourier–transform Approach for k–space Trajectory Measurement" Alley et al, Proceedings of International Soc. of Magn. Res. in Med., Abstract 1996, p. 1406.

* cited by examiner

Primary Examiner—Christine K. Oda
Assistant Examiner—Dixomara Vargas
(74) Attorney, Agent, or Firm—Skarasten Law Offices; Christian G. Cabou; Phyllis Y. Price

(57) ABSTRACT

A method for acquiring spatially and spectrally selective MR images by means of an MR imaging system includes the step of selecting an SPSP pulse sequence, comprising a succession of RF sub-pulses and an oscillatory gradient magnetic field, which is disposed to select a slice through a subject. The method further includes measuring specified parameters of a perturbation magnetic field associated with the imaging system, and deriving an expression for the perturbation field from respective measured parameters and from the oscillatory gradient magnetic field. A specified ideal frequency modulation function, associated with the SPSP sequence, is disposed to offset the slice to a particular spatially localized region of the subject. The SPSP pulse sequence is modified by adjusting the frequency modulation function in specified corresponding relationship with the expression. The modified SPSP pulse sequence is then applied to the subject to excite a selected spectral species in the spatially localized region, while substantially reducing signal intensity loss resulting from the perturbation magnetic field.

10 Claims, 4 Drawing Sheets

METHOD FOR ACQUIRING SPATIALLY AND SPECTRALLY SELECTIVE MR IMAGES

BACKGROUND OF THE INVENTION

The invention disclosed and claimed herein generally pertains to an improved method for acquiring spatially and spectrally localized magnetic resonance (MR) images. More particularly, the invention pertains to a method of such type which corrects or compensates for undesirable effects caused by a perturbation magnetic field, which is produced by an oscillatory slice-selection gradient required for data acquisition.

As is well known by those of skill in the arts relating to MR imaging, a sequence known as a spatial-spectral (SPSP) pulse sequence, or SPSP pulse, can be used to excite a selected spectral species, in a spatially localized region. That is, the SPSP pulse sequence selects a particular slice through a subject (spatial localization) and at the same time selects material lying within the slice which has a particular spectral frequency range, such as water or fat. Such pulse sequences have been found to be especially useful in fast imaging sequences, for suppressing fat signals. Use of the SPSP pulse in an MR imaging sequence is described in further detail in the prior art, such as U.S. Pat. No. 4,999,580, issued Mar. 12, 1991 to Meyer et al.

As is further well known, an SPSP pulse sequence includes a slice-selection gradient field G(t), which oscillates as the SPSP pulse is being played out, so that two-dimensional (k,t)-space can be traversed to simultaneously achieve spatial and spectral localization. The SPSP pulse sequence further includes an RF pulse, comprising a succession of RF sub-pulse components having an envelope defined by the peaks of respective sub-pulses. The shape of the RF sub-pulses and the gradient determine the slice profile. If an MR image is to be acquired from a slice offset by a distance z from the iso-center of an associated MR system (i.e., the center of the MR main magnet), the SPSP pulse has an associated frequency modulation function $f_z(t)$ related to the gradient G(t), for an ideal arrangement, by the expression $f_z(t)=\gamma G(t)z/2\pi$, where $\gamma$ is the gyromagnetic ratio for a given spin species, e.g., protons. It is noted that since the gradient oscillates, the frequency modulation function $f_z(t)$ oscillates as well.

Unfortunately, the SPSP pulse sequence typically results in an arrangement which is not ideal. The oscillatory gradient, required for use with the SPSP pulse as stated above, often produces undesirable effects, such as eddy currents and non-linear gradient amplifier response. These effects, in turn, generate perturbation magnetic fields, which result in considerable signal intensity loss for large values of z, that is, for slices distant from the MR magnet iso-center.

SUMMARY OF THE INVENTION

The invention is directed to a method for acquiring spatially and spectrally selective MR images from a subject positioned proximate to an MR imaging system. The method includes the step of selecting an SPSP pulse sequence, comprising a succession of RF sub-pulses and an oscillatory gradient magnetic field, the SPSP sequence being disposed to select a slice through the subject for imaging. Specified parameters of a perturbation magnetic field associated with the imaging system are measured, and an expression for the perturbation field is derived from the parameters and from the SPSP gradient magnetic field. The method further includes specifying a frequency modulation function associated with the SPSP sequence which is disposed to offset the selected slice to a particular spatially localized region of the subject. The SPSP pulse sequence is modified by adjusting the frequency modulation function thereof, in speciffed corresponding relationship with the derived expression for the perturbed oscillatory gradient, and the modified SPSP pulse is applied to the subject to excite a selected spectral species in the spatially localized region.

A useful embodiment of the invention is directed to a situation wherein the perturbation field comprises a time-dependent magnetic field induced by eddy currents produced by the oscillatory gradient. The measuring step for such embodiment comprises measuring amplitudes and time constants respectively associated with the eddy currents. The amplitudes and time constants are then employed to derive the perturbation field expression.

In another useful embodiment, wherein the perturbation field results from a non-ideal response of the gradient amplifier or the like, the expression for the perturbation field can be derived by means of a self-encoding technique. Such technique is described, for example, in an article entitled "A Fourier-transform approach for k-space trajectory measurement", Alley et al., Proceedings of International Society of Magnetic Resonance in Medicine, Abstracts, p. 1406 (1996).

In a preferred embodiment of the invention, the expression for the perturbation field comprises a time varying function, and the SPSP pulse sequence modifying step comprises adding such function to the specified frequency modulation function.

OBJECTS OF THE INVENTION

An object of the invention is to provide an improved MR imaging sequence of the type employing an SPSP pulse sequence, wherein signal intensity loss resulting from a perturbation magnetic field, produced by the oscillatory gradient of the sequence, is substantially reduced.

Another object is to provide an arrangement of the above type, wherein signal intensity loss is reduced by determining parameters associated with the perturbation magnetic field, and then using the parameters to analytically derive an expression for the perturbation field.

Another object is to provide an arrangement of the above type, wherein the perturbation field expression is employed to adjust the frequency modulation function of the SPSP pulse sequence, in order to match the actual time-dependent magnetic field.

These and other objects of the invention will become more readily apparent from the ensuing specification, taken together with the accompanying drawings.

DETAILED DESCRIPTION OF THE PREFERRED EMBODIMENT

Figure 1:
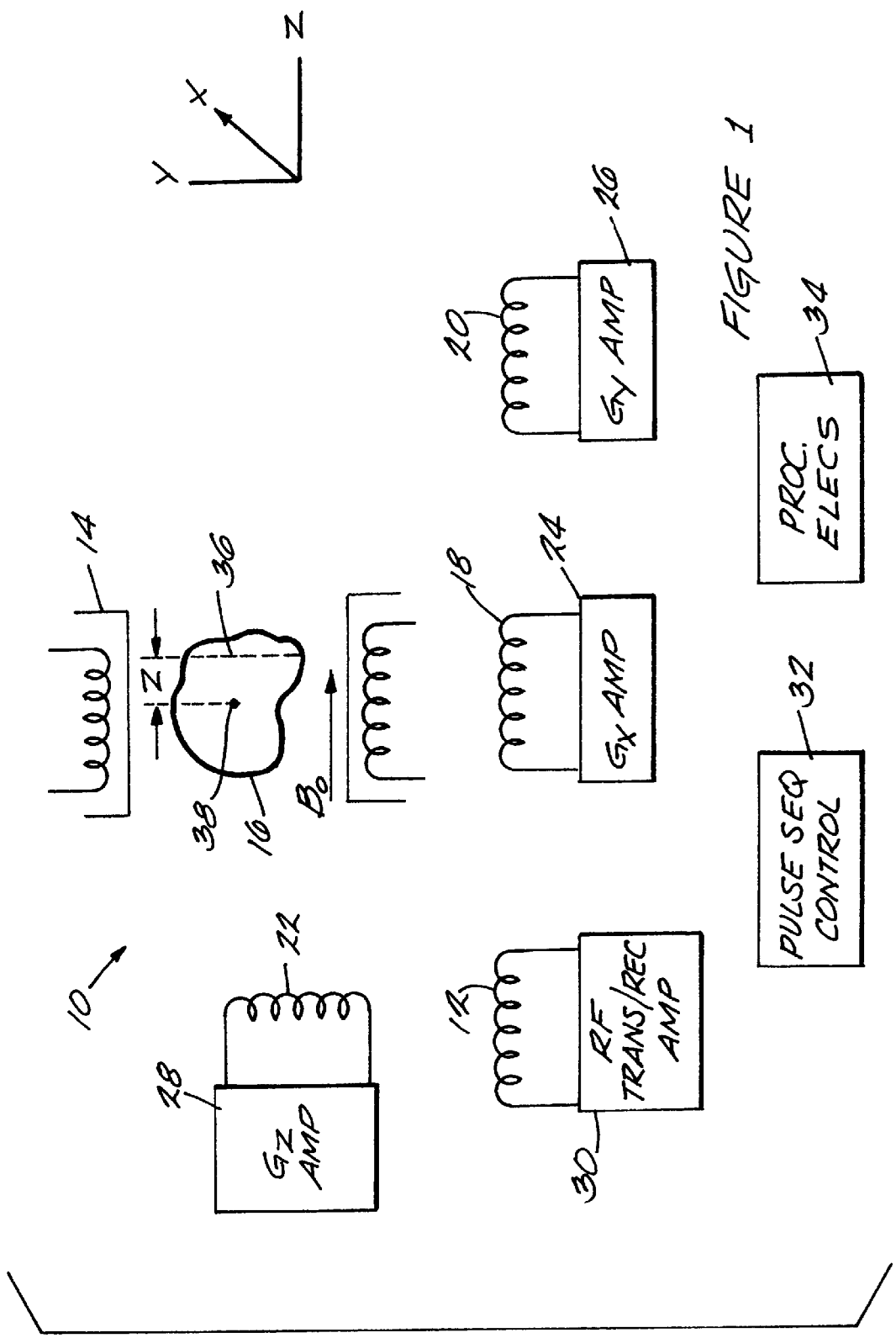
FIG. 1 is a schematic diagram showing basic components of an MR system for use in practicing an embodiment of the invention.

Referring to FIG. 1, there are shown the basic components of an MR system 10 which may be operated to acquire MR data by means of an SPSP pulse sequence, and also to compensate for effects of a perturbation field caused thereby, as described herein. System 10, in addition to an RF coil 12, includes a magnet 14 for generating a main or static magnetic field $B_0$, in the bore of a cylindrical magnet containing a patient or other imaging subject 16. System 10 further includes gradient coils 18, 20 and 22 for generating $G_x$, $G_y$, and $G_z$ magnetic field gradients relative to the orthogonal X-,Y- and Z-Cartesian reference axes, respectively. FIG. 1 shows each of the gradient coils 18, 20 and 22 respectively driven by amplifiers 24, 26 and 28, and RF coil 12 is coupled to transmit/receive amplifier 30. Referring further to FIG. 1, there is shown system 10 provided with a pulse sequence control 32, which is operated to control the RF and gradient amplifiers, and to thereby generate pulse sequences to produce and acquire sets of MR image data. System 10 also includes computation and processing electronics 34, for applying the method of the invention to correct errors in the acquired data, resulting from the presence of a gradient-related perturbation magnetic field. Electronics 34 employs the corrected MR data to construct an image of the patient 16, the data being acquired from a spatially localized region or slice 36 taken through the patient. For purposes of illustration, the slice 36 is spaced along the z-axis a distance z, from the iso-center 38 of system 10.

The construction, functions, and interrelationships of the respective components of MR System 10 described above are well known and described in the prior art in full detail, such as in U.S. Pat. No. 5,672,969, issued on Sep. 30, 1997 to Zhou et al.

Figure 2:
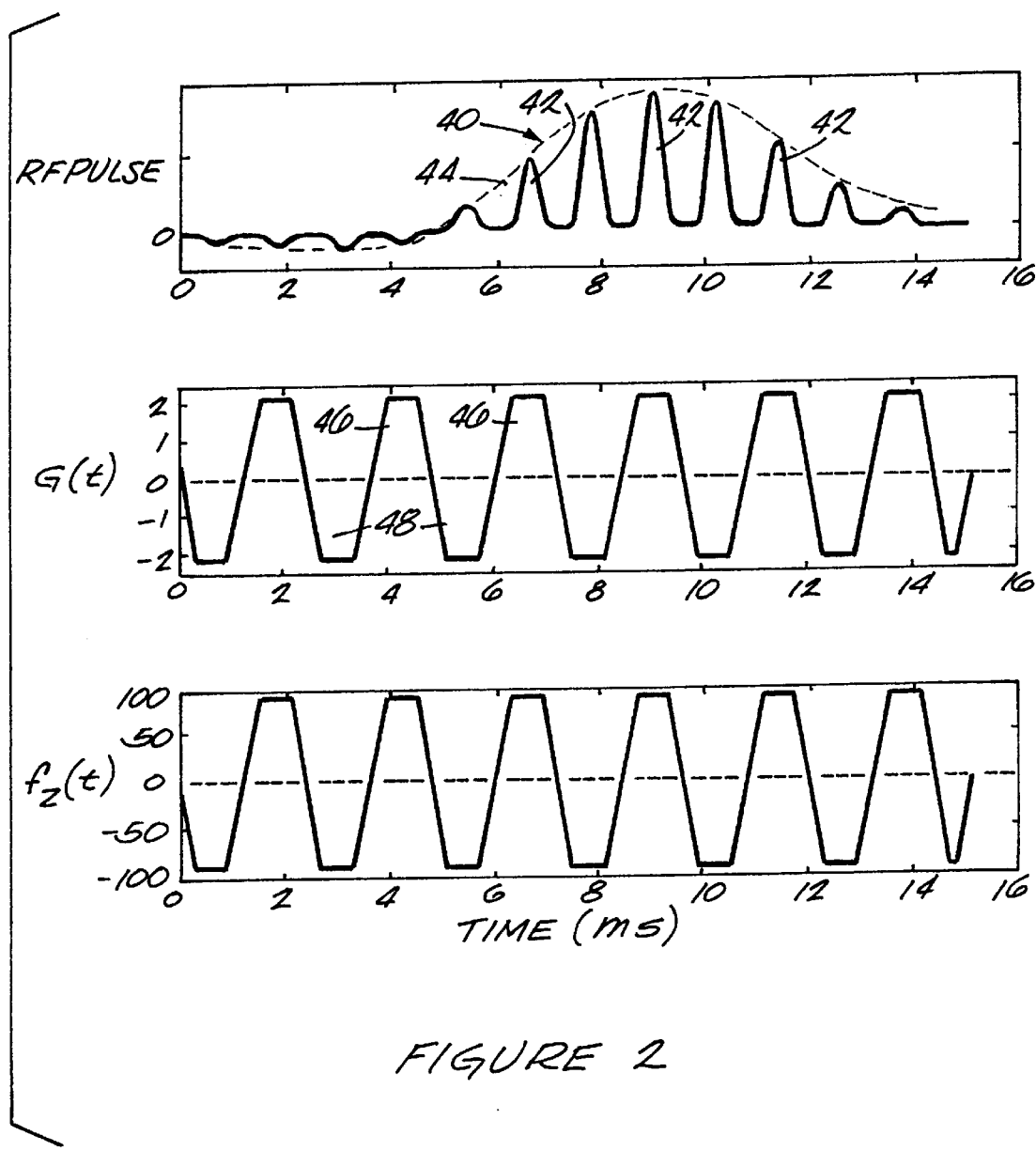
FIG. 2 shows an SPSP pulse sequence diagram in the absence of a perturbation magnetic field.

Referring to FIG. 2, there is shown an RF pulse for MR imaging, comprising the RF pulse 40 of an SPSP pulse sequence, as described herein. RF pulse 40 is produced, such as by operating RF coil 12 or the like, to generate a train or succession of RF sub-pulse components 42. Pulse 40 is shown to have an envelope 44, which is defined by respective peaks of RF pulse components 42.

FIG. 2 further shows an ideal slice-selection magnetic field gradient G(t) for the SPSP pulse sequence. For purposes of illustration, gradient field $G_z$, referenced with respect to the Z-axis of MR system 10 and produced by operation of coil 22 thereof, is used herein as gradient G(t). However, it is to be understood that gradient G(t) could alternatively be a gradient field referenced with respect to other axes besides the Z-axis, or a combination of two or three gradients in the case of an oblique slice. It will be seen that gradient G(t) oscillates over time. Thus, G(t) comprises alternating positive lobes 46 and negative lobes 48, each positive lobe 46 being symmetrical to a negative lobe 48. G(t) is represented in FIG. 2 in units of Gauss/cm.

Referring further to FIG. 2, there is shown a frequency modulation function $f_z(t)$ for the SPSP pulse sequence. As stated above, spatial localization, i.e., the offset of the imaging slice 36, is determined by $f_z(t)$, represented in FIG. 2 in kHz. $f_z(t)$ is related to the oscillatory slice-selection gradient, which determines the slice width, as follows:

$$f_z(t)=\gamma G(t)z/(2\pi) \qquad \text{Eqn. (1)}$$

where z is the offset of imaging slice 36.

Figure 3:
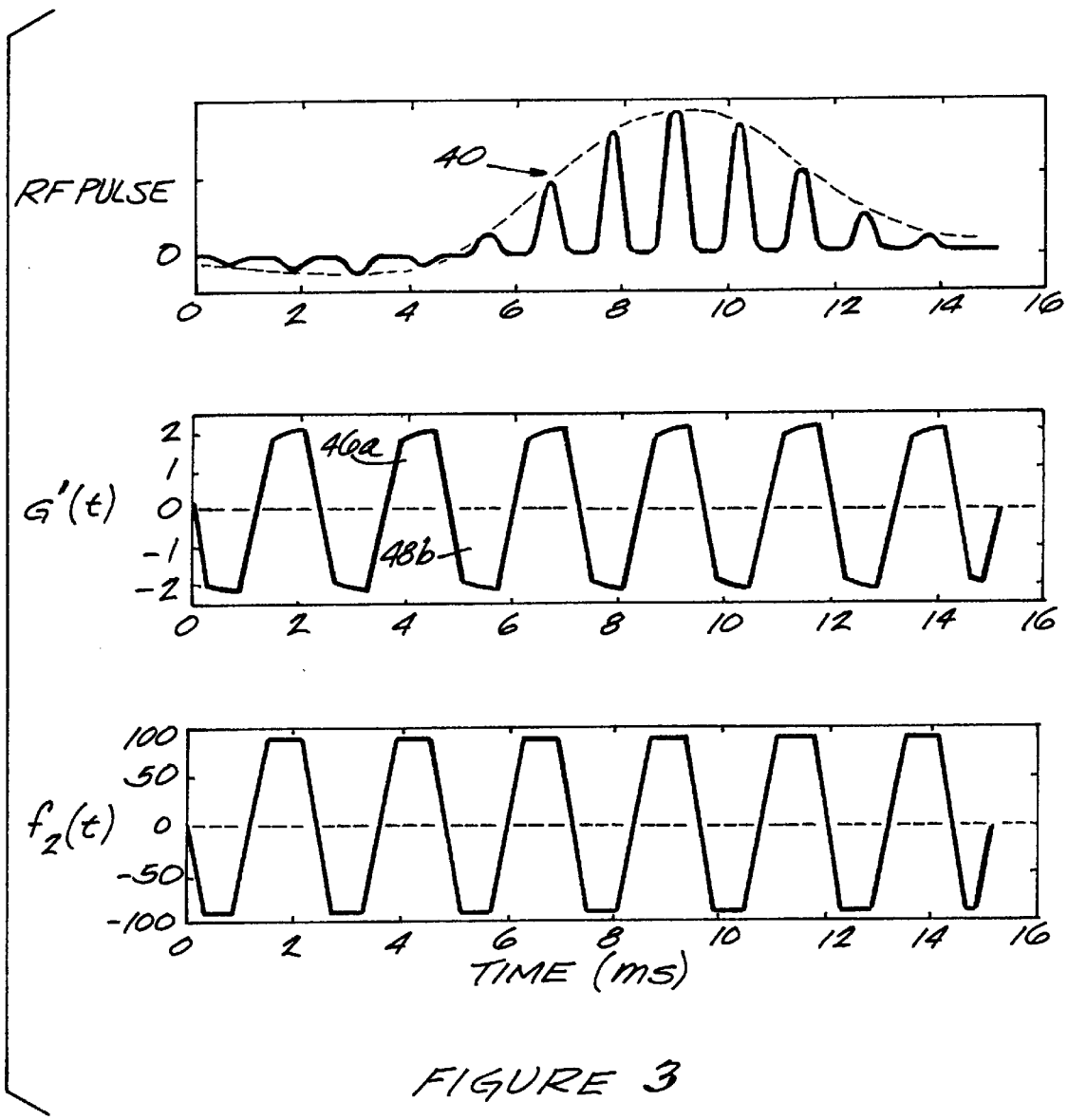
FIG. 3 shows an SPSP pulse sequence having a gradient affected by a perturbation magnetic field.

If the oscillatory gradient induces eddy currents, the overall time-dependent magnetic field not only contains the G(t)z term, but also includes a perturbation magnetic field, comprising an eddy currents-induced field $b_{perturb}(t)$. A perturbation magnetic field can alternatively result from effects such as non-linear or other non-ideal characteristic of the gradient amplifier used to generate the oscillatory gradient. Referring to FIG. 3, there is shown the resultant time dependent magnetic field G'(t), where G'(t) is derived from the combined effect of the ideal gradient G(t) and the spatially linear component of $b_{perturb}(t)$. The positive and negative lobes of G'(t) are distorted to lobes 46a and 48a, respectively. As a result of the presence of the perturbation magnetic field, substantial loss of acquired MR signal can occur, for slices not located at the magnet's iso-center.

In accordance with the invention, it has been realized that the frequency modulation function of the SPSP pulse sequence can be adjusted to $f_z'(t)$, in order to match the actual time dependent field. This is achieved by deriving $f_z'(t)$ as follows:

$$f_z'(t)=\gamma[G(t)z+b_{perturb}(t)]/(2\pi) \qquad \text{Eqn. (2)}$$

Figure 4:
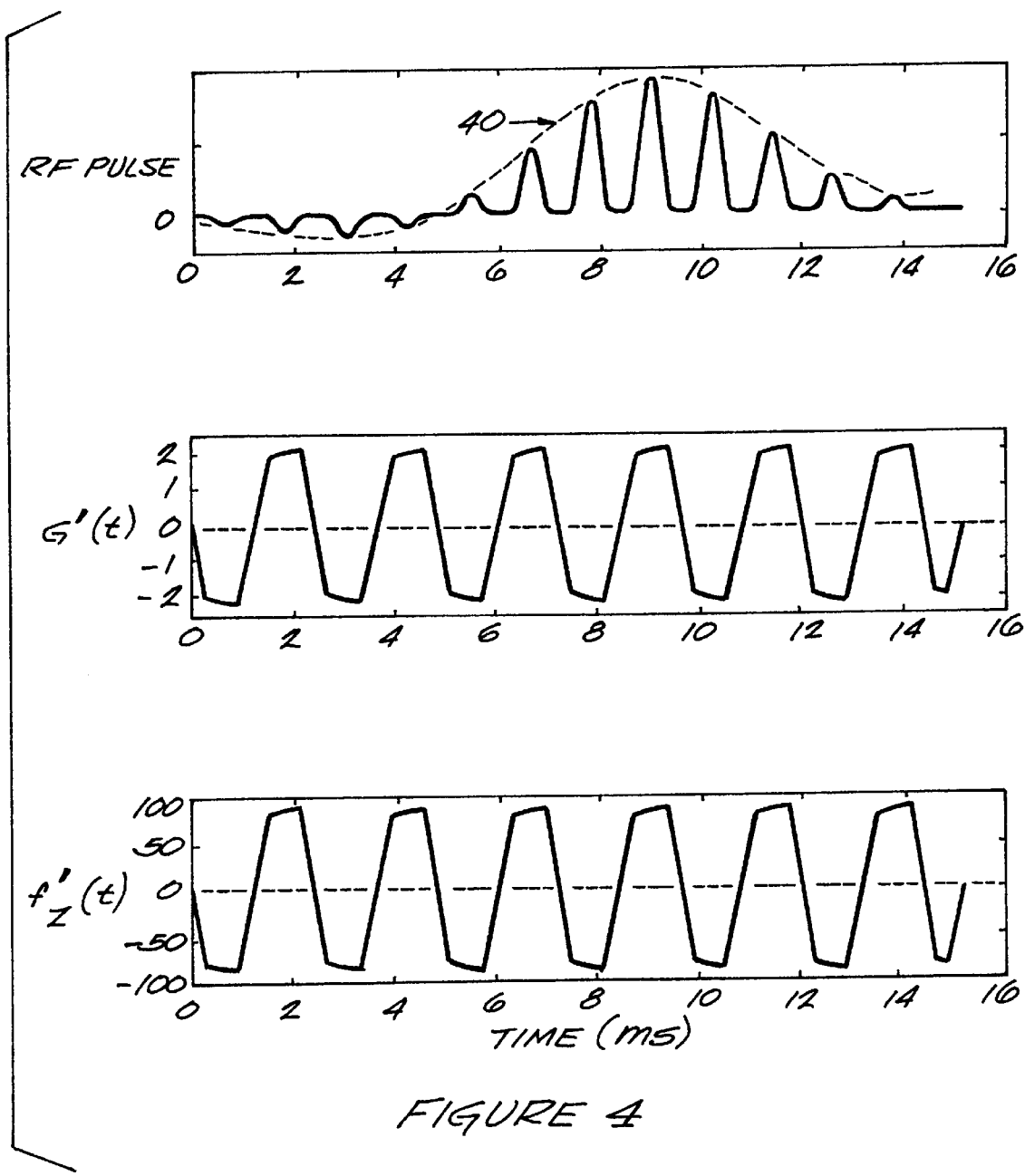
FIG. 4 shows an SPSP pulse sequence diagram wherein the effect of the perturbation field has been compensated by means of an embodiment of the invention.

Referring to FIG. 4, there is shown the frequency modulation function of the SPSP pulse sequence modified to the expression $f_z'(t)$. It is found that by using $f_z'(t)$ in imaging, rather than the ideal expression $f_z(t)$ given by Eqn. (1), the signal loss problem can be virtually eliminated. It will be readily apparent that in order to determine $f_z'(t)$, it is necessary to derive an expression for the perturbation magnetic field $b_{perturb}(t)$. If the perturbation field is generated by eddy currents induced by gradient G(t), $b_{perturb}(t)$ may be analytically calculated by means of a technique known in the art as GRAFIDY, described, for example, in U.S. Pat. No. 4,698,591, issued Oct. 6, 1987 to Glover et al. In accordance with such technique, the gradient field G(t) is initially produced prior to imaging, to generate eddy currents and the perturbation field resulting therefrom, proximate to the imaging subject. The amplitudes $\alpha_i$ and time constants $\tau_i$ of respective eddy current components are measured, and then used to derive an expression for $b_{perturb}(t)$, as follows:

$$b_{perturb}(t) = \sum_{i=1}^{N} \alpha_i e^{-t/\tau_i} \otimes \frac{dG(t)}{dt} \qquad \text{Eqn. (3)}$$

where N is the total number of eddy current components, and the symbol $\otimes$ represents convolution.

If the perturbation field is caused by an effect other than eddy currents, such as by gradient amplifier non-ideal response, $b_{perturb}(t)$ can be determined by means of the self-encoding technique referred to above, Alley et al, supra. In accordance with such technique, data acquired by executing a test waveform is Fourier transformed along a self-encoding direction to provide a resulting data array having the form:

$$I(k(t),x_{se})=\rho(x_{se})e^{-i\phi(t)}e^{-ik(t)x_{se}} \qquad \text{Eqn. (4)}$$

In Equation (4) k(t) represents the evolving location in k-space produced by the test waveform placed along the x-axis, and $x_{se}$ is the spatial variable. $\rho(x_{se})$ is the spatial density profile of an associated phantom, and $\phi(t)$ is the accumulated phase offset due to eddy currents, susceptibility effects, and any other non-ideal factors. A full data set is comprised of two interleaved acquisitions in which the sign of k(t) is alternated by negating the test waveform. The phase across the phantom projection is then used to extract k(t) and any local $\phi(t)$ variations. With this technique the size of the test phantom determines the self-encode spacing. The number of self-encodes is chosen to make the resolution element $\Delta x_{se}$ smaller than the design resolution of the test waveform.

Obviously, many other modifications and variations of the present invention are possible in light of the above teachings. It is therefore to be understood that within the scope of the disclosed concept, the invention may be practiced otherwise than as specifically described.

What is claimed is:

1. A method for acquiring spatially and spectrally selective MR images from a subject by means of an MR imaging system comprising the steps of:

selecting an SPSP pulse sequence comprising a succession of RF sub-pulses and an oscillatory gradient magnetic field, said SPSP pulse sequence disposed to select a slice through said subject;

measuring specified parameters of a perturbation magnetic field associated with said imaging system;

deriving an expression comprising a time dependent function for said perturbation field from said measured parameters and from said oscillatory gradient magnetic field;

specifying a frequency modulation function associated with said SPSP pulse sequence which is disposed to offset said selected slice to a particular spatially localized region of said subject;

modifying said SPSP pulse sequence by adding said time dependent function to said specified frequency modulation function; and applying said modified SPSP pulse sequence to said subject to excite a selected spectral species in said spatially localized region.

2. The method of claim 1 wherein:

said perturbation field comprises a magnetic field induced by eddy currents produced by said oscillatory gradient.

3. The method of claim 2 wherein:

said measuring step comprises measuring amplitudes and time constants respectively associated with said eddy currents, said amplitudes and time constants being employed to derive said expression.

4. The method of claim 3 wherein:

said expression is calculated from said amplitudes and time constants in accordance with a GRAFIDY technique.

5. The method of claim 1 wherein:

said expression for said perturbation field is derived by means of a self-encoding technique.

6. A method for operating an MR imaging system to excite a selected spectral species in a selected spatially localized region of a subject, said method comprising the steps of:

selecting an SPSP pulse sequence comprising a succession of RF sub-pulses and an oscillatory gradient magnetic field, said SPSP pulse sequence disposed to select a slice through said subject;

measuring specified parameters of a perturbation magnetic field associated with said imaging system, said perturbation magnetic field including a spatially variant field component;

deriving an expression representing said spatially variant field component of said perturbation field from said measured parameters and from said oscillatory gradient magnetic field;

specifying a frequency modulation function associated with said SPSP pulse sequence which is disposed to offset said selected slice to said selected spatially localized region of said subject;

modifying said SPSP pulse sequence by adjusting said frequency modulation function in specified corresponding relationship with said expression representing said spatially variant field component; and applying said modified SPSP pulse sequence to said subject to excite said selected spectral species in said spatially localized region.

7. The method of claim 6 wherein:

said perturbation field comprises a magnetic field having a spatially linear field component induced by eddy currents produced by said oscillatory gradient.

8. The method of claim 7 wherein:

said measuring step comprises measuring amplitudes and time constants respectively associated with said eddy currents, said amplitudes and time constants being employed to derive said expression.

9. The method of claim 8 wherein:

said expression is calculated from said amplitudes and time constants in accordance with a selected analytical technique.

10. The method of claim 6 wherein:

said expression comprises a time dependent function, and said SPSP pulse sequence modifying step comprises adding said time dependent function to said specified frequency modulation function.

* * * * *